(12) United States Patent
Scherschmidt

(10) Patent No.: US 11,843,237 B2
(45) Date of Patent: Dec. 12, 2023

(54) DEVICE FOR DETECTING AN ELECTRIC ARC IN AN ELECTRONIC ASSEMBLY USING A MODIFIED PIERCE OSCILLATOR

(71) Applicant: Webasto SE, Stockdorf (DE)

(72) Inventor: Jürgen Scherschmidt, Munich (DE)

(73) Assignee: WEBASTO SE, Stockdorf (DE)

( * ) Notice: Subject to any disclaimer, the term of this patent is extended or adjusted under 35 U.S.C. 154(b) by 10 days.

(21) Appl. No.: 17/606,689

(22) PCT Filed: Mar. 17, 2020

(86) PCT No.: PCT/EP2020/057184
§ 371 (c)(1),
(2) Date: Oct. 26, 2021

(87) PCT Pub. No.: WO2020/221501
PCT Pub. Date: Nov. 5, 2020

(65) Prior Publication Data
US 2022/0216684 A1    Jul. 7, 2022

(30) Foreign Application Priority Data
Apr. 30, 2019   (DE) .......................... 102019111139.0

(51) Int. Cl.
*H02H 1/00*    (2006.01)
*H02H 3/16*    (2006.01)

(52) U.S. Cl.
CPC ............ *H02H 1/0015* (2013.01); *H02H 3/16* (2013.01)

(58) Field of Classification Search
CPC ............................... H02H 3/16; H02H 1/0015
(Continued)

(56) References Cited

U.S. PATENT DOCUMENTS

2002/0183944 A1   12/2002   Dollar, II
2005/0286184 A1*  12/2005   Campolo ............. H01R 25/003
                                                       361/42
(Continued)

FOREIGN PATENT DOCUMENTS

DE          10203163 A1    8/2003
DE     102014206925 A1    10/2015
(Continued)

OTHER PUBLICATIONS

Unknown. "Lecture 4—Crystal Oscillators" Digital Electronics, Jan. 1, 2014 (Jan. 1, 2014), pp. 1,2,17- pp. 18,24, https://edisciplinas.usp.br/pluginfile.php/4840418/mod_resource/content/1/Crystal%20Oscillators.pdf, retrieved from the Internet.
(Continued)

*Primary Examiner* — Danny Nguyen
(74) *Attorney, Agent, or Firm* — Concept IP LLP; Michael Zarrabian

(57) ABSTRACT

The invention relates to a device for detecting an electric arc in an electronic assembly, having: a transmission unit for generating an output signal, and an evaluation unit for receiving the output signal, where the transmission unit and the evaluation unit are connected to one another, where the transmission unit comprises an oscillator unit that generates an output signal having a frequency and/or an amplitude, and where the evaluation unit is configured to detect deviations, caused by an arc, in the output signal from the transmission unit. There is in particular a provision to implement the oscillator unit by way of a modified Pierce oscillator having an inverter, where the quartz is replaced by a detector coil. The invention furthermore relates to an electronic assembly of a motor vehicle having an apparatus to be controlled, in particular having a heating apparatus and having said device, and to a method for detecting an electric arc in an electronic assembly.

13 Claims, 1 Drawing Sheet

(58) Field of Classification Search
USPC .................................................. 361/42–50
See application file for complete search history.

(56) References Cited

U.S. PATENT DOCUMENTS

| | | | | |
|---|---|---|---|---|
| 2011/0141644 A1* | 6/2011 | Hastings | ........... | H01L 31/02021 |
| | | | | 361/93.2 |
| 2014/0062500 A1* | 3/2014 | Behrends | ................ | H02S 50/10 |
| | | | | 324/537 |
| 2014/0071564 A1* | 3/2014 | Kim | ....................... | G01R 31/14 |
| | | | | 361/42 |

FOREIGN PATENT DOCUMENTS

| | | |
|---|---|---|
| DE | 102015224807 A1 | 11/2016 |
| WO | 2013014250 A1 | 1/2013 |
| WO | 2014032650 A1 | 3/2014 |

OTHER PUBLICATIONS

Anonymous. "Oscillator with CMOS inverter—calculate elements—Electrical Engineering Stack Exchange," Dec. 1, 2014 (Dec. 1, 2014), the whole document, https://electronics.stackexchange.com/questions/141050/oscillator-with-cmos-inverter-calculate-elements, retrieved from the Internet.

International Search Report for PCT/EP2020/057184 dated Jun. 29, 2020.

\* cited by examiner

DEVICE FOR DETECTING AN ELECTRIC ARC IN AN ELECTRONIC ASSEMBLY USING A MODIFIED PIERCE OSCILLATOR

CROSS-REFERENCE TO RELATED APPLICATIONS

This application is a 35 U.S.C. § 371 National Stage Entry of International Application No. PCT/EP2020/057184 filed Mar. 17, 2020, which claims the priority benefit of German Patent Application Serial Number DE 102019111139.0 filed Apr. 30, 2019, all of which are incorporated herein by reference in their entirety for all purposes.

The invention relates to a device for detecting an electric arc in an electronic assembly, to an electronic assembly of a motor vehicle having the device for detecting an electric arc, and to a method for detecting an electric arc in an electronic assembly.

In modern motor vehicles, the on-board electrical system voltage has been increased from the previously usual 12 V to 42 V or up to 800 V, since the energy required to supply an increasing number of consumers can be made available at higher voltages at a reasonable cost.

However, due to the increase in the on-board electrical system voltage, there is a risk of contact between a line or an assembly of higher potential and a line/assembly or the vehicle body that is at ground potential, each of which has a comparatively lower potential. Arcs can form between these different potentials.

Since it is known that arcs can occur from an operating voltage of around 16 V, this risk is evident in modern motor vehicles.

In order to detect arcs now, a device of the generic type is known from WO 03/007450 A1.

This discloses that, for the initiation of suitable protective measures for the detection of an arc in a 42V on-board electrical system of a motor vehicle in order to protect a current-carrying supply line, provision is made for a detection line to be at least partially routed along this supply line.

In this case, the flow of current via the supply line is at least reduced by means of a detection current flowing via the detection line as a result of an arc.

With regard to arcs, it is also known that they have a high temperature, which in turn entails the risk that a stable operating point of an arc will be established and the arc will thus be self-sustaining. This can cause considerable damage to the vehicle.

As a result, in electrical engineering/electronics, in particular in automotive electronics, and wherever electronic assemblies are connected or assembled, there is a risk of electric arcs occurring in the event of a fault, which can lead to high levels of heat development and therefore to considerable consequential damage and personal injury.

It is therefore the object of the present invention to provide a device for detecting an electric arc in an electronic assembly and a method for detecting an electric arc in an electronic assembly, which can be produced cost-effectively and in a material-saving manner and preferably reliably detects an arc, and to transfer an electronic assembly, which is affected by the arc, to a safe, in particular de-energized, state. The electronic assembly, which is transferred to a safe, in particular de-energized, state therefore does not have to be the assembly in which the arc occurs. The arc that is detected can also occur in another location, for example in another electronic assembly.

According to the invention, this object is achieved by the features of the independent patent claims. Further advantageous developments are the subject of the dependent claims.

According to the invention, in a first aspect of the present invention, a device for detecting an electric arc in an electronic assembly comprises:
  a transmission unit for generating an output signal, and an evaluation unit for receiving the output signal,
  wherein the transmission unit and the evaluation unit are connected to one another,
  wherein the transmission unit and the evaluation unit are preferably connected to one another by radio and/or by cable.

The transmission unit preferably comprises an oscillator unit, which generates an output signal, in particular in the form of a voltage, having a frequency and/or an amplitude.

Furthermore, it is preferred that the evaluation unit is configured to detect deviations, caused by an electric arc, in the output signal of the transmission unit.

The evaluation unit is also expediently used to evaluate the output signal and preferably to take into account and/or implement information contained therein.

In summary, the evaluation unit can check the correct functioning of the oscillator unit and thus of the transmission unit by—in simple terms—the evaluation unit checking whether the output signal deviates from a predetermined tone generated by the oscillator unit, that is to say a different tone than previously received. Therefore, the evaluation unit can thus detect detuning of the transmission unit due to an arc.

If this is the case or if the transmission unit is "out of tune", the evaluation unit detects a fault in the oscillator unit of the transmission unit.

It is also advantageous when the device is configured to transfer the transmission unit and/or an apparatus to be controlled, such as a heating apparatus, in particular an air and/or water heater, to a safe state.

A safe state is advantageously understood to mean the transfer of the transmission unit and/or the apparatus to be controlled to a de-energized state.

The evaluation unit is preferably configured to detect an arc, which leads to a change in the frequency and/or amplitude of the output signal, within or outside the transmission unit and/or an apparatus to be controlled and to bring about a safe switch-off of the transmission unit and/or an apparatus to be controlled.

The evaluation unit is preferably configured to generate a control signal for switching off the transmission unit and/or an apparatus to be controlled, wherein the control signal can preferably be received by the transmission unit and/or by a switching element for switching off the transmission unit and/or an apparatus to be controlled. This allows the transmission unit and/or an apparatus to be controlled to be transferred to a de-energized state.

The device expediently comprises a switching element for switching off the transmission unit and/or an apparatus to be controlled, wherein the switching element is preferably arranged within or outside the transmission unit and/or the apparatus to be controlled.

It is also advantageous when the switching element is configured to switch off the transmission unit and/or an apparatus to be controlled after receiving a control signal from the evaluation unit. The transmission unit and/or the apparatus to be controlled can therefore be transferred to a de-energized state.

Furthermore, it is advantageous if the switching element is designed to establish or to interrupt the power supply to the transmission unit and/or to an apparatus to be controlled. Therefore, after reception of a control signal from the evaluation unit, the power supply to the transmission unit and/or the apparatus to be controlled can thus be interrupted, since an arc has been detected by the evaluation unit by evaluating the output signal of the transmission unit. Furthermore, it is also possible to activate or reactivate the transmission unit and/or the apparatus to be controlled by virtue of the evaluation unit or another unit of another electronic assembly establishing or re-establishing the power supply to the transmission unit and/or the apparatus to be controlled via the switching element.

The evaluation unit is advantageously configured to compare the output signal of the transmission unit after reception with an output signal that is stored in the evaluation unit.

It is also preferred that a negative comparison indicates an arc in the transmission unit.

For such a case, the evaluation unit is preferably configured to transfer the transmission unit and/or an apparatus to be controlled, such as a heating apparatus, in particular an air and/or water heater, to a safe state.

Furthermore, for such a case, it is preferred that the evaluation unit is configured to generate a control signal for safely switching off the transmission unit and/or an apparatus to be controlled. This control signal for switching off the transmission unit and/or the apparatus to be controlled can be received, for example, by the transmission unit or by a switching element for switching off the transmission unit and/or the apparatus to be controlled.

The evaluation unit advantageously comprises a memory for the stored output signal and/or a comparator for comparing the stored output signal with the received output signal of the transmission unit.

Furthermore, it is advantageous when the evaluation unit is configured to measure a frequency of the output signal and, in the event of a deviation in the frequency of the transmission unit, caused by an arc that has occurred at least partially within the transmission unit and/or the apparatus to be controlled, to generate a control signal for safely switching off the transmission unit and/or the apparatus to be controlled.

The evaluation unit is advantageously configured to measure an amplitude of the output signal and, in the event of a deviation in the amplitude of the transmission unit, caused by an arc that has occurred at least partially within the transmission unit and/or the apparatus to be controlled, to generate a control signal for safely switching off the transmission unit and/or the apparatus to be controlled.

The evaluation unit is preferably configured to transmit the control signal for safely switching off the transmission unit and/or an apparatus to be controlled to the transmission unit and/or to a switching element for switching off the transmission unit and/or an apparatus to be controlled. The transmission unit and/or the apparatus to be controlled can therefore be transferred to a de-energized state.

The transmission unit and/or the oscillator unit and/or the switching element are advantageously connected to one another, in particular electrically connected to one another.

Furthermore, provision can be made for the transmission unit, in particular the oscillator unit, to generate the output signal having a frequency and/or an amplitude.

The output signal is advantageously designed as a voltage having a frequency and/or an amplitude.

It is also advantageous when the oscillator unit is designed as an LC oscillator.

It is also advantageous when the oscillator unit is constructed in the form of a Pierce circuit, wherein the quartz oscillator normally used in the Pierce circuit is preferably replaced by a coil. With regard to a configuration of the oscillator unit in the form of a Pierce circuit, the so-called Schmitt trigger, which is used as an amplifier stage, can also be omitted.

The frequency-determining inductance of the transmission unit, in particular of the oscillator unit, is advantageously constructed as a detector coil, wherein the inductance or the detector coil is preferably in the form of a PCB coil.

Furthermore, it is preferred that the inductance or the detector coil is designed in a spiral shape, wherein the inductance or the detector coil is preferably the size of one square centimeter.

In conclusion with regard to the device, it should be mentioned that:

a) preferably the oscillator unit can be implemented very inexpensively (approx. 5 cents);
b) preferably the evaluation unit can be implemented either in the HVH Gen 2.0 ASIC or in the HVH Gen 2.0 microcontroller;
c) preferably the required PCB surface area only requires 2-4 square centimeters including the PCB coil;
d) preferably the oscillator unit has a very low power consumption (2 mA).

A second aspect of the present invention comprises an electronic assembly of a motor vehicle having an apparatus to be controlled, in particular having a heating apparatus, preferably having an air heater and/or having a water heater.

It is expressly pointed out that the features of the device for detecting an electric arc, as are mentioned under the first aspect, can be used individually or in combination with one another in the electronic assembly.

In other words, the features mentioned above under the first aspect of the invention relating to the device for detecting an electric arc can also be combined here under the second aspect of the invention with further features.

An electronic assembly of a motor vehicle preferably comprises an apparatus to be controlled, in particular a heating apparatus such as an air heater and/or a water heater and also preferably a device for detecting an electric arc according to the first aspect.

The apparatus to be controlled may be a high-voltage unit or a heating apparatus in the high-voltage range, wherein the high-voltage range preferably has a voltage of over 12 volts, in particular of 42 or 48 volts or up to 800 V.

It is also advantageous if the assembly or the device according to the first aspect of the present invention is configured in such a way that the transmission unit of the device and/or the apparatus to be controlled of the assembly, such as a heating apparatus, in particular an air and/or water heater, can be transferred to a safe state.

A safe state is preferably understood here to mean the transfer of the transmission unit and/or the apparatus to be controlled to a de-energized state.

The apparatus to be controlled is advantageously connected, in particular electrically connected, to a transmission unit and/or to an oscillator unit and/or to a switching element of the device according to the first aspect.

It is also preferred that the assembly includes a system voltage in the high-voltage range, preferably of over 12 volts, in particular 42 or 48 volts or up to 800 V.

A third aspect of the present invention comprises a method for detecting an electric arc in an electronic assembly.

It is expressly pointed out that the features of the device for detecting an electric arc, as mentioned under the first aspect, can be used individually or in combination with one another in the method for detecting an electric arc in an electronic assembly.

In addition, it is expressly pointed out that the features of the electronic assembly, as mentioned under the second aspect, can be used individually or in combination with one another in the method for detecting an electric arc in an electronic assembly.

In other words, the features mentioned above under the first aspect of the invention relating to the device and the features mentioned above under the second aspect of the invention relating to the electronic assembly can also be combined here under the third aspect of the invention with further features.

The method according to the invention for detecting an electric arc in an electronic assembly preferably comprises the following steps.

One step advantageously comprises transmitting an output signal from a transmission unit to an evaluation unit.

A further step of the method preferably comprises receiving the output signal in the evaluation unit.

A further step preferably comprises comparing the received output signal with a stored output signal. A change in the output signal can be detected in this way.

In the case of a negative comparison, in which the received output signal does not correspond to the stored output signal, a further step of the method advantageously comprises transmitting a control signal from the evaluation unit to the transmission unit and/or to a switching element for switching off the transmission unit and/or for switching off an apparatus to be controlled of an electronic assembly according to the second aspect of the present invention. After an arc has been detected, the transmission unit and/or the apparatus to be controlled can thus be transferred to a de-energized state.

It is also possible that the switching element transfers the transmission unit and/or the apparatus to be controlled to a de-energized state.

The method according to the invention advantageously uses the device according to the first aspect of the present invention.

The invention is explained in more detail below using an exemplary embodiment in conjunction with associated drawings, in which schematically:

In the following description, the same reference symbols are used for the same subjects.

FIG. 1 shows a schematic view of a device 1 according to the invention for detecting an electric arc.

Figure 1:
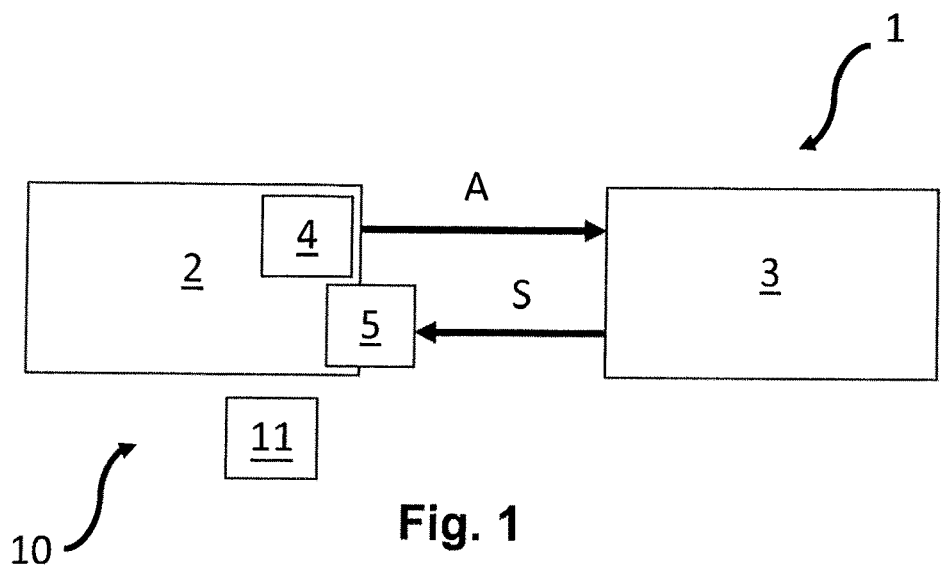
FIG. 1 shows a schematic view of a device according to the invention for detecting an electric arc.

FIG. 1 shows in more detail a device 1 having a transmission unit 2 for generating an output signal A and an evaluation unit 3 for receiving the output signal A, wherein the transmission unit 2 and the evaluation unit 3 are connected to one another.

The evaluation unit 3 is also preferably used to evaluate the output signal A and preferably to take into account and/or implement information contained therein.

In the present example, the transmission unit 2 and the evaluation unit 3 are connected to one another by cable. A radio connection is also conceivable.

As FIG. 1 also shows, the transmission unit 2 has an oscillator unit 4, which generates the output signal A having a frequency and an amplitude.

In this case, the evaluation unit 3 is configured to detect deviations, caused by an arc, in the output signal A of the transmission unit 2.

Illustrated more precisely, the evaluation unit 3 is configured to detect an arc, which leads to a change in the frequency and/or amplitude of the output signal A, within or outside the transmission unit 2 and to bring about a safe switch-off of the transmission unit 2 by virtue of the transmission unit 2 being transferred to a safe state. The transmission unit 2 can thus be transferred to a de-energized state.

Furthermore, the evaluation unit 3 is configured to generate a control signal S for switching off the transmission unit 2, which control signal can be received by a switching element 5 for switching off the transmission unit 2.

As shown by the arrangement of the switching element 5 in FIG. 1, the switching element 5 can be effected within or outside the transmission unit 2.

As already mentioned, the switching element 5 is configured to switch off the transmission unit 2 after receiving a control signal S from the evaluation unit 3. The transmission unit 2 can thus be transferred to a de-energized state.

In other words, the switching element 5 is able to guarantee or to establish or interrupt the power supply to the transmission unit 2.

In order that the evaluation unit 3 can detect different output signals A in terms of frequency and/or amplitude, the evaluation unit 3 is configured to compare the output signal A of the transmission unit 2 after reception with an output signal that is stored in the evaluation unit 3.

Here, a negative comparison indicates an arc in the transmission unit 2, wherein, for such a case, the device 1—as already described—is configured to transfer the transmission unit 2 to a safe state by virtue of a control signal S for safely switching off the transmission unit 2 being generated.

Of course, the evaluation unit 3 has a memory for the stored output signal and a comparator for comparing the stored output signal with the received output signal A of the transmission unit 2.

Described again in other words, the evaluation unit 3 is configured to measure a frequency and/or an amplitude of the output signal A and, in the event of a deviation in the frequency and/or the amplitude of the transmission unit 2, caused by an arc that has occurred at least partially within the transmission unit 2, to generate a control signal S for safely switching off the transmission unit 2.

In this case, the evaluation unit 3 is configured to transmit the control signal S for safely switching off the transmission unit 2 to the switching element 5 for switching off the transmission unit 2.

Figure 2:
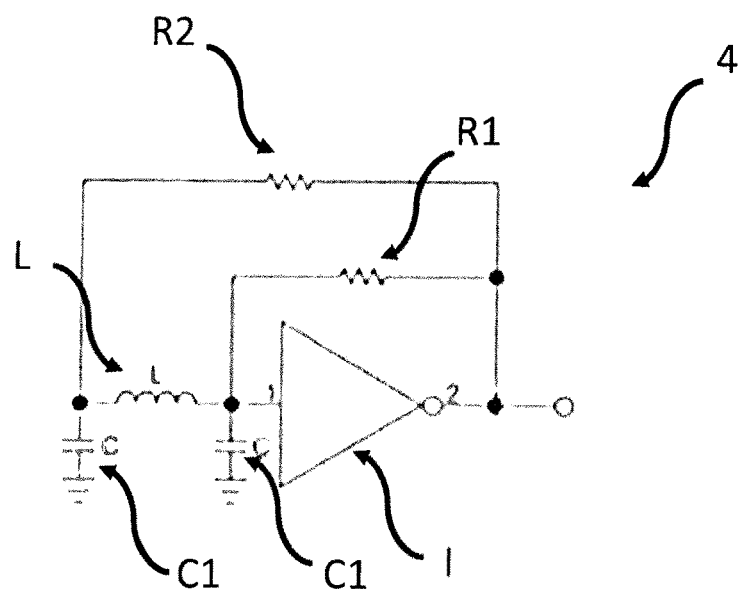
FIG. 2 shows a schematic view of an oscillator unit from FIG. 1.
Figure 3:
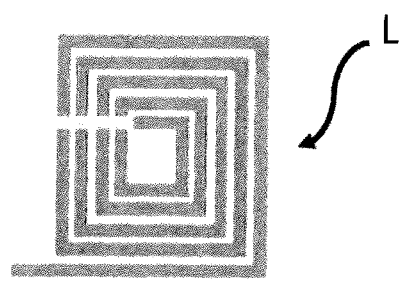
FIG. 3 shows a schematic view of a coil of the oscillator unit from FIG. 3.

FIG. 2 shows a schematic view of the oscillator unit 4 from FIG. 1, wherein FIG. 3 illustrates a schematic view of a coil of the oscillator unit 4 from FIG. 3.

As already mentioned several times, the transmission unit 2 or the oscillator unit 4 generates the output signal A having a frequency and/or an amplitude, wherein the output signal A is designed as a voltage or as a voltage signal.

In this case, according to FIG. 2, the oscillator unit 4 is constructed in the form of a Pierce circuit, wherein the quartz oscillator normally used in the Pierce circuit is replaced by a coil L.

With regard to a configuration of the oscillator unit 4 in the form of a Pierce circuit, the so-called Schmitt trigger, which is used as an amplifier stage, is also omitted.

As FIG. 2 shows, the oscillator unit 4 in the form of a Pierce circuit has a resistor R1, which ensures the linear operation of an inverter I (for example component 74HC04).

A resistor R2 limits the peak current. The coil L or the inductance L is located in the feedback branch.

The two capacitors C1, C2 are used for phase shifting in order to reliably meet the phase condition of 180°.

As shown in FIG. 2, the oscillator unit 4 is designed—in other words—as an LC oscillator, wherein the frequency-determining inductance L of the oscillator unit 4 is constructed as a detector coil.

In the present case, the inductance L or the detector coil is designed as a PCB coil and in a spiral shape, wherein the inductance L is the size of one square centimeter (see FIG. 3).

For the sake of completeness, it should be mentioned that the described device 1 for detecting an electric arc can be arranged in an electronic assembly 10 of a motor vehicle.

According to FIG. 1, the electronic assembly 10 of a motor vehicle comprises, in addition to the device 1, an apparatus 11 to be controlled, in particular a heating apparatus 11.

The assembly 10 is configured here in such a way that the apparatus 11 to be controlled or the heating apparatus 11 of the assembly 10 can be transferred to a safe state, wherein the switching element 5 of the device 1 transfers the apparatus 11 to be controlled to a safe state.

Illustrated more precisely, the evaluation unit 3 is configured to detect an arc, which leads to a change in the frequency and/or amplitude of the output signal A, within or outside the heating apparatus 11 and to bring about a safe switch-off of the apparatus 11 to be controlled, which can be configured as a heating apparatus, in particular as an air and/or water heater, by virtue of the heating apparatus 11 to be controlled being transferred to a safe state.

In this context, it should also be mentioned that the evaluation unit 3 can detect different output signals A with regard to frequency and/or amplitude. In this case, the evaluation unit 3 is configured to compare the output signal A of the transmission unit 2 after reception with an output signal that is stored in the evaluation unit 3.

A negative comparison indicates an arc in the transmission unit 2 and/or the heating apparatus 11 to be controlled, wherein, for such a case, the device 1 or the electronic assembly 10—as already described—is configured to transfer the heating apparatus 11 to a safe state by means of the switching element 5.

In this case, the assembly can include a system voltage in the high-voltage range, of over 12 volts, in particular of 42 or 48 volts or up to 800 V.

Finally, a method for detecting an electric arc in an electronic assembly is briefly described.

This method uses the device 1 presented and comprises the steps of:
a) transmitting an output signal A from a transmission unit 2 to an evaluation unit 3,
b) receiving the output signal A in the evaluation unit 3,
c) comparing the received output signal A with a stored output signal,
d) in the event of a negative comparison, in which the received output signal A does not correspond to the stored output signal, transmitting a control signal S from the evaluation unit 3 to a switching element 5 for switching off the transmission unit 2 and/or the apparatus 11 to be controlled of the electronic assembly 10.

LIST OF REFERENCE SIGNS

1 Device for detecting an electric arc
2 Transmission unit
3 Evaluation unit
4 Oscillator unit
5 Switching element
10 Assembly
11 Heating apparatus
A Output signal
S Control signal
L Inductance/coil
R1 Resistor
R2 Resistor
C1 Capacitance/capacitor
C2 Capacitance/capacitor
I Inverter

The invention claimed is:

1. A device for detecting an electric arc in an electronic assembly, comprising:
   a transmission unit configured to generate an output signal, and
   an evaluation unit configured to receive the output signal,
   wherein the transmission unit and the evaluation unit are connected to one another,
   wherein the transmission unit comprises an oscillator unit, which is configured to generate the output signal having at least one of: a frequency and an amplitude,
   wherein the evaluation unit is configured to detect deviations, caused by an arc, in the output signal of the transmission unit,
   wherein the oscillator unit is designed as an LC oscillator comprising a frequency-determining inductance, which is constructed as a detector coil, and
   wherein the detector coil is designed as at least one of: a PCB coil and in a spiral shape.

2. The device as claimed in claim 1,
   wherein the evaluation unit is further configured to transfer at least one of: the transmission unit and an apparatus to be controlled, to a safe state,
   wherein the evaluation unit is configured to detect an arc, which leads to a change in at least one of: the frequency and the amplitude of the output signal, within or outside the at least one of: the transmission unit and the apparatus to be controlled and to trigger a safe switch-off of at least one of: the transmission unit and the apparatus to be controlled,
   wherein the evaluation unit is configured to generate a control signal for switching off at least one of: the transmission unit and the apparatus to be controlled, wherein the control signal is configured to be received by at least one of: the transmission unit and a switching element for switching off at least one of: the transmission unit and the apparatus to be controlled.

3. The device as claimed in claim 2,
   wherein the device comprises a switching element for switching off at least one of: the transmission unit and the apparatus to be controlled,
   wherein the switching element is arranged at least one of: within and outside the at least one of: the transmission unit and the apparatus to be controlled,
   wherein the switching element is configured to switch off at least one of: the transmission unit and the apparatus to be controlled after receiving a control signal from the evaluation unit,
   wherein the switching element is designed to at least one of: establish and to interrupt the power supply to at least one of: the transmission unit and the apparatus to be controlled.

4. The device as claimed in claim 3,
wherein the evaluation unit is configured to compare the output signal of the transmission unit after reception with an output signal that is stored in the evaluation unit,
wherein a negative comparison indicates an arc in at least one of: the transmission unit and the apparatus to be controlled,
wherein, in case of a negative comparison, the device is configured to transfer at least one of: the transmission unit and the apparatus to be controlled to a safe state,
wherein, in case of a negative comparison, the evaluation unit is configured to generate a control signal for safely switching off at least one of: the transmission unit and the apparatus to be controlled,
wherein the evaluation unit comprises a memory for at least one of: the stored output signal and/or a comparator for comparing the stored output signal with the received output signal of the transmission unit.

5. The device as claimed in claim 4,
wherein the evaluation unit is configured to measure at least one of: a frequency and an amplitude of the output signal and, in the event of a deviation in at least one of: the frequency and the amplitude of the transmission unit, caused by an arc that has occurred at least partially within at least one of: the transmission unit and the apparatus to be controlled, to generate a control signal for safely switching off at least one of: the transmission unit and the apparatus to be controlled,
wherein the evaluation unit is configured to transmit the control signal for safely switching off at least one of: the transmission unit and the apparatus to be controlled to at least one of: the transmission unit and a switching element for switching off at least one of: the transmission unit and the apparatus to be controlled.

6. The device as claimed in claim 5,
wherein the output signal is designed as a voltage having at least one of: a frequency and an amplitude.

7. An electronic assembly of a motor vehicle having an apparatus to be controlled, and having a device for detecting an electric arc, wherein the device comprises:
a transmission unit configured to generate an output signal, and
an evaluation unit configured to receive the output signal,
wherein the transmission unit and the evaluation unit are connected to one another,
wherein the transmission unit comprises an oscillator unit, which is configured to generate an output signal having at least one of: a frequency and an amplitude,
wherein the evaluation unit is configured to detect deviations, caused by an arc, in the output signal of the transmission unit,
wherein the oscillator unit is designed as an LC oscillator comprising a frequency-determining inductance, which is constructed as a detector coil, and
wherein the detector coil is designed as at least one of: a PCB coil and in a spiral shape.

8. The electronic assembly as claimed in claim 7,
wherein at least one of: the assembly and the device is configured such that the transmission unit of at least one of: the device and the apparatus to be controlled of the assembly may be transferred to a safe state,
wherein, a switching element of the device transfers at least one of: the transmission unit and the apparatus to be controlled to a safe state.

9. A method for detecting an electric arc in an electronic assembly comprising the following steps:
transmitting an output signal from a transmission unit to an evaluation unit,
receiving the output signal in the evaluation unit,
wherein the transmission unit comprises an oscillator unit, which is configured to generate an output signal having at least one of: a frequency and an amplitude,
comparing the received output signal with a stored output signal, and,
in the event of a negative comparison, in which the received output signal does not correspond to the stored output signal, transmitting a control signal from the evaluation unit to at least one of: the transmission unit and a switching element for switching off at least one of: the transmission unit and the apparatus to be controlled of an electronic assembly,
wherein the oscillator unit is designed as an LC oscillator comprising a frequency-determining inductance, which is constructed as a detector coil, and
wherein the detector coil is designed as at least one of: a PCB coil and in a spiral shape.

10. The method as claimed in claim 9,
wherein the method uses the device comprising:
a transmission unit configured to generate an output signal, and
an evaluation unit configured to receive the output signal,
wherein the transmission unit and the evaluation unit are connected to one another, and
wherein the evaluation unit is configured to detect deviations, caused by an arc, in the output signal of the transmission unit.

11. The device as claimed in claim 1, wherein the apparatus to be controlled is a heating apparatus.

12. The device as claimed in claim 11, wherein the heating apparatus is at least one of: an air heater and a water heater.

13. The electronic assembly as claimed in claim 7, wherein the apparatus to be controlled is a heating apparatus.

* * * * *